US007287178B1

(12) United States Patent
Milne et al.

(10) Patent No.: US 7,287,178 B1
(45) Date of Patent: Oct. 23, 2007

(54) COMMUNICATION BETWEEN CLOCK DOMAINS OF AN ELECTRONIC CIRCUIT

(75) Inventors: Roger B. Milne, Boulder, CO (US); Jonathan B. Ballagh, Longmont, CO (US); Jeffrey D. Stroomer, Lafayette, CO (US)

(73) Assignee: Xilinx, Inc., San Jose, CA (US)

( * ) Notice: Subject to any disclaimer, the term of this patent is extended or adjusted under 35 U.S.C. 154(b) by 435 days.

(21) Appl. No.: 11/095,282

(22) Filed: Mar. 31, 2005

(51) Int. Cl.
*G06F 1/12* (2006.01)
(52) U.S. Cl. .................................... 713/600; 713/400
(58) Field of Classification Search ................ 713/600, 713/400, 501
See application file for complete search history.

(56) References Cited

U.S. PATENT DOCUMENTS

| 6,000,037 | A | * | 12/1999 | Herbert ....................... 713/400 |
| 6,029,253 | A | * | 2/2000 | Houg .......................... 713/600 |
| 6,145,016 | A | * | 11/2000 | Lai et al. ....................... 710/4 |
| 6,418,494 | B1 | * | 7/2002 | Shatas et al. ................ 710/305 |
| 7,134,035 | B2 | * | 11/2006 | Sharma et al. .............. 713/500 |
| 7,219,250 | B2 | * | 5/2007 | Abendroth et al. ......... 713/400 |

OTHER PUBLICATIONS

U.S. Appl. No. 10/949,049, filed Sep. 24, 2004, Milne et al.
U.S. Appl. No. 11/075,340, filed Mar. 8, 2005, Ballagh et al.

* cited by examiner

*Primary Examiner*—Thuan Du
(74) *Attorney, Agent, or Firm*—LeRoy D. Maunu

(57) ABSTRACT

Methods are provided for creating an electronic system. A subsystem hierarchy is created that includes a plurality of subsystems for the electronic system. Certain subsystems are associated with a clock domain including a first subsystem associated with one clock domain and a second subsystem associated with another clock domain. A first stub component is instantiated in the first subsystem and a second stub component is instantiated in the second subsystem. Each stub component is instantiated in a parent subsystem and is coupled to signals in the parent subsystem. Stub components are matched based on user-configurable data associated with each stub component. Each set of matching stub components is replaced with a synchronizer component selected based on type data associated with each stub component. The signals in the parent subsystem for the matched stub components are coupled to the selected synchronizer component.

20 Claims, 4 Drawing Sheets

COMMUNICATION BETWEEN CLOCK DOMAINS OF AN ELECTRONIC CIRCUIT

FIELD OF THE INVENTION

The present invention generally relates to communicating between clock domains in an electronic circuit.

BACKGROUND

Electronic designs generally consist of components that communicate with one another through signals. A portion of an electronic design is called a "subsystem". A subsystem is "synchronous" provided it operates at a single rate or at several rates that are related to one another in a predictable way. In hardware, rates for a synchronous subsystem are often achieved by using a combination of clocks and clock enables. The particular combination varies with design goals and the capabilities of the underlying hardware. At one extreme, a different clock may be used for each rate without clock enables or with clock enables that are tied high; at the other extreme, a single clock is employed and the rates are achieved by "stepping down" the clock with various clock enables. Often, a mixture of these approaches is used.

An entire design may be synchronous, such as when all rates in the design are related. Often, however, a design is "asynchronous", i.e., some rates are unrelated to others. We use the term "clock domain" to describe a synchronous subsystem of a design. This means that within a given clock domain, all rates are related. Typically, a clock domain is a maximal synchronous subsystem of the design, such that no two different clock domains have related rates. Thus, a synchronous design consists of a single clock domain and an asynchronous design consists of at least two clock domains. Special "synchronizer" components are usually employed to communicate between clock domains. Synchronizer components must be rate insensitive or at least have less rate sensitivity than a typical component. So-called asynchronous FIFOs and shared memories are examples of such synchronizer components.

Simulators for electronic designs usually support both synchronous and asynchronous designs. This, for example, is the case in the hardware simulator known as ModelSim (sold by ModelTech, Inc.). When a design is known to be purely synchronous, specialized simulation strategies may be employed including cycle-based simulation and cycle-based hardware co-simulation. Such specialized simulation strategies may provide significantly increased simulation speed. However, such specialized simulation strategies may not be applicable to asynchronous designs.

The present invention may address one or more of the above issues.

SUMMARY OF THE INVENTION

Various embodiments of the invention provide a method for creating an electronic system. A subsystem hierarchy is created that includes a plurality of subsystems for the electronic system. Certain subsystems are associated with a clock domain including a first subsystem associated with one clock domain and a second subsystem associated with another clock domain. A first stub component is instantiated in the first subsystem and a second stub component is instantiated in the second subsystem. Each stub component is instantiated in a parent subsystem and is coupled to signals in the parent subsystem. Stub components are matched based on user-configurable data associated with each stub component. Each set of matching stub components is replaced with a synchronizer component selected based on type data associated with each stub component. The signals in the parent subsystem for the matched stub components are coupled to the selected synchronizer component.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings in which.

DETAILED DESCRIPTION

Various embodiments of the present invention are described in terms of representing communication between clock domains for various specifications of an electronic system, including the specification of an implementation of the electronic system in a Programmable Logic Device (PLD). Those skilled in the art will appreciate, that the invention could be implemented in various types of PLDs (for example, field programmable gate arrays and complex programmable logic devices) based on both volatile and non-volatile technologies, integrated circuits that include programmable logic circuitry, and/or adapted to various application requirements.

Environments for creating an electronic design usually allow the electronic design to be organized into subsystems. In one embodiment of the invention, a design may be partitioned in such a way that each clock domain becomes a subsystem. Two clock domains may communicate by using a respective "stub" component included in the subsystem corresponding to each clock domain. Each stub component may represent a half of a shared memory object.

During simulation, the halves of a shared memory object behave as though they form a single component even though the halves are not explicitly connected. For example, if one stub component represents the input end of an asynchronous FIFO and another stub component represents the output end, then simulation values fed into the input end eventually appear at the output end. The connection between the halves need not be explicit; instead, the connection may be established implicitly by assigning each half a shared name or similar tag. The lack of an explicit connection between stub components may allow the electronic system to be efficiently simulated by simulating each clock domain in a cycle-based simulator and linking together the simulations of the individual clock domains into a system simulation.

When the design is realized in hardware, the halves may be unified into a single shared memory to transform the implicit line of communication into an explicit one.

Figure 1:
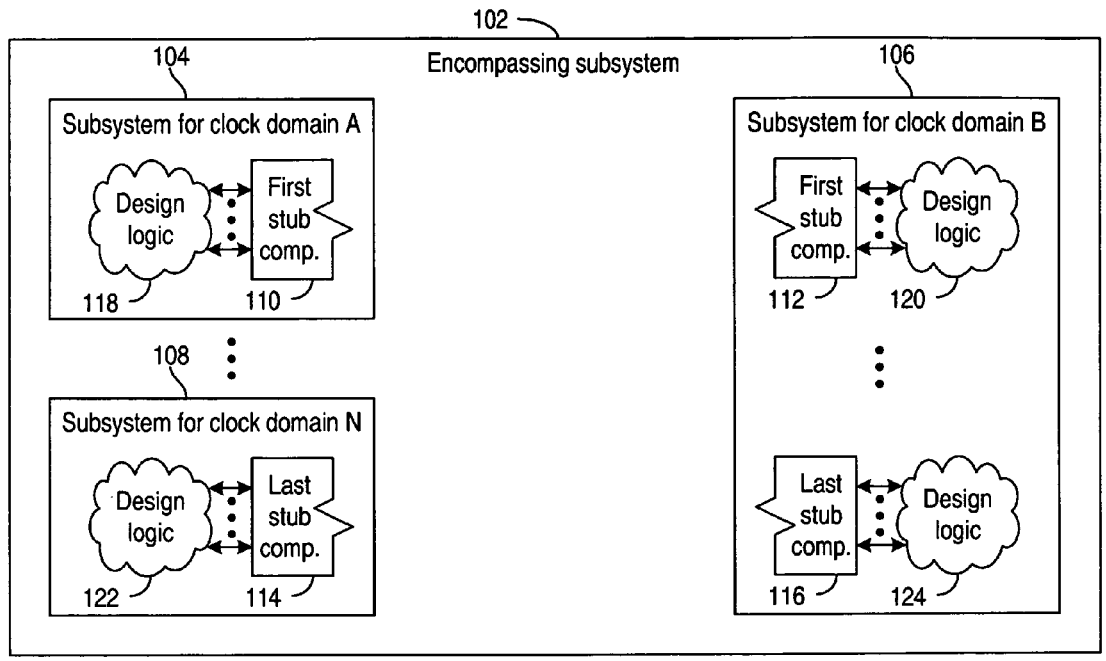
FIG. 1 is a block diagram specifying communication between multiple clock domains using stub components, according to various embodiments of the invention.

FIG. 1 is a block diagram specifying communication between multiple clock domains using stub components, according to various embodiments of the invention. A subsystem 102 may include respective subsystems for clock domains 104, 106, and 108.

Each clock domain 104, 106, and 108 is a subsystem that may be a clock-synchronous circuit. A synchronous circuit with timing controlled by a single clock signal is a clock-synchronous circuit. A synchronous circuit with timing controlled by a single clock signal and derived clock enable signals also may be a clock-synchronous circuit. In addition, a circuit with timing controlled by multiple clock signals that have a known timing relationship may be a clock-synchronous circuit. Generally, a clock-synchronous circuit is a portion of an electronic system having timing information provided by one or more clock signals having a known timing relationship.

The timing information for a clock signal may be provided by transitions of the clock signal, for example, the rising edge of the clock signal. A clock enable signal may select certain transitions of the clock signal to provide timing information. For example, a clock enable signal may be generated by a toggle flip-flop controlled by the clock signal, and the resulting clock enable signal may be used to select timing information from alternating rising edges of the clock signal.

Typically, multiple clock signals having a known timing relationship are each derived from a reference clock signal by multiplying the frequency of the reference clock by an integer and/or dividing the frequency of the reference clock by an integer, while keeping a known phase relationship between each derived clock and the reference clock. Circuitry, such as phase-lock loops and delay-locked loops, may be used to derive a clock having a frequency that is a rational multiple of the frequency of the reference clock and that tracks the phase of the reference clock.

A clock domain, such as clock domain 104, may consist of circuits of an electronic system that are identified by a designer of the system as having timing information provided by one or more clock signals having a known timing relationship. The identification of the circuits may be made, in part, by grouping the circuits into a subsystem of the system. A clock domain may correspond to a clock-synchronous circuit, and for proper operation of the system, a clock domain generally corresponds to at most one clock-synchronous circuit. A designer may choose to split a clock-synchronous circuit into multiple clock domains 104, 106, and 108.

For the clock domains 104, 106, and 108 to cooperate to implement the functionality of subsystem 102, data generally needs to be transferred between the clock domains 104, 106, and 108. Transferring data between clock domains, for example transferring data from domain-A 104 to domain-B 106, generally requires data synchronization. Because the respective clocks for domain-A 104 and domain-B 106 may have an unknown timing relationship, a sampling of data from domain-A 104 by domain-B 106 may sample the data during a transition of the data. Thus, the sampled data may be meta-stable, possibly resulting in indeterminate behavior by domain-B 106.

For certain cases of data synchronization, such as data that is transferred from domain-A 104 to domain-B 106 on a single signal, any meta-stability of the output of a register clocked in domain-B 106 and having an input from domain-A 104 may generally be resolved by a second sampling of the output of the register by another register in domain-B 106, also known as "double-register" synchronization. Other possible synchronization components include asynchronous FIFOs and dual port memories. Data synchronization typically occurs between two clocks domains, such as domain-A 104 and domain-B 106.

Various embodiments of the invention may represent a synchronizer component used to synchronize data between domain-A 104 and domain-B 106 as a pair of associated stub components 110 and 112. Similarly, associated stub components 114 and 116 may represent a synchronizer component used to synchronize data that is transferred between domain-N 108 and domain B 106, where N is an integer. Generally data communication between two clock domains requires a synchronizer component and various embodiments of the invention typically represent each synchronizer component as a pair of associated stub components.

The associations among stub components 110, 112, 114, and 116 may be formed by a shared tag such as a shared name. Stub components 110 and 112 may be associated by sharing the name "First" and stub components 114 and 116 may be associated by sharing the name "Last". Alternatively, the stub components may be explicitly linked by a user by way of a wire connection in the block diagram.

A characteristic of many data synchronization components is that memory is included in the data synchronization component, with the memory accessible from one of several clock domains via a respective interface for each clock domain. In one embodiment of the invention, each stub component 110, 112, 114, and 116 is specified as having ports corresponding to an interface for a clock domain of a synchronization component.

In one example, the synchronization component represented by associated stub components 110 and 112 may be a dual port memory, with stub component 110 having ports corresponding to one of the memory ports and stub component 112 having ports corresponding to the other one of the memory ports. In another example, the synchronization component represented by associated stub components 114 and 116 may represent a unidirectional asynchronous FIFO, with stub component 114 having ports corresponding to an input port of the FIFO and stub component 116 having ports corresponding to an output port of the FIFO.

Each stub component 110, 112, 114, and 116 may also have a type (not shown) corresponding to the type of synchronizer component. For example, a unidirectional asynchronous FIFO may have an input port in domain-N 108 and an output port in domain-B 106, with stub component 114 having type of "input for asynchronous FIFO" and stub component 116 having type "output for asynchronous FIFO".

In one embodiment, each stub component 110, 112, 114, and 116 is a "black box" with ports corresponding to the ports of an interface for a clock domain of a synchronizer component, but the stub component does not have any functional contents.

In another embodiment, each stub component 110, 112, 114, and 116 includes functional contents of the memory and associated circuitry for the corresponding synchronizer component. Associated stub components, for example 114 and 116, may each include independent copies of the memory for the corresponding synchronizer component.

The stub components 110, 112, 114, and 116 with functional contents may permit testing of the individual subsystems 104, 106, and 108 including the interaction of design logic 118, 120, 122, and 124 with the appropriate synchronizer component. The testing of individual subsystems 104, 106, and 108 may be accomplished by a behavioral simulator that is a cycle-based simulator, possibly but not necessarily including hardware-based co-simulation for one or more of the subsystems 104, 106, and 108.

Additional simulation mechanisms may link the cycle-based simulations for the individual subsystems 104, 106, and 108 to produce a simulation for the encompassing subsystem 102. More generally, specialized simulation techniques suitable only for synchronous designs may be employed on the individual subsystems.

Figure 2:
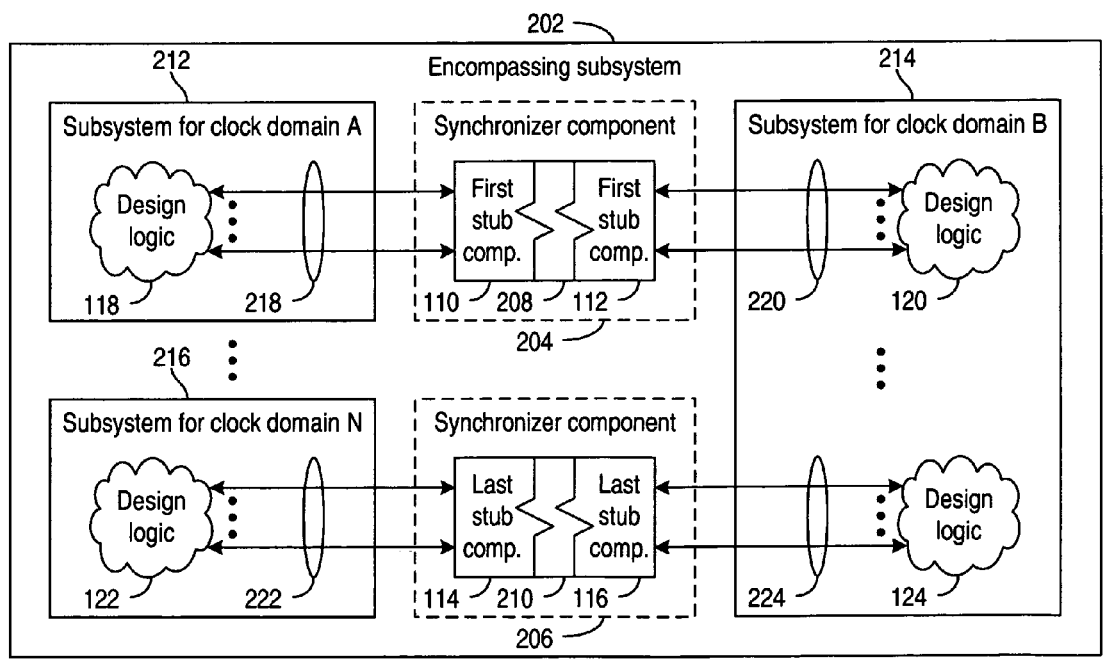
FIG. 2 is a block diagram specifying communication between multiple clock domains using synchronizer components, according to various embodiments of the invention.

FIG. 2 is a block diagram specifying communication between multiple clock domains using synchronizer components, according to various embodiments of the invention. The subsystem 202 of FIG. 2 may correspond to a transformation of the subsystem 102 of FIG. 1 that matches the stub components 110, 112, 114, and 116, replaces the matched pair of stub components 110 and 112 with the synchronizer component 204, and replaces the matched pair of stub components 114 and 116 with synchronizer component 206.

Stub component 204 includes respective interfaces for the clock domains provided by stub components 110 and 112. Stub component 206 may similarly include stub components 114 and 116. Portion 208 of the synchronizer component 204 may represent the memory contents of the synchronizer component 204. In one embodiment, stub components 110 and 112 provide the interfaces of stub component 204, and portion 208 adds the memory contents to the synchronizer component 204.

In another embodiment, stub components 114 and 116 each include independent versions of the memory contents of the synchronizer component 206, and portion 210 represents the merging of these memory contents to form the synchronizer component 206. A merging of memory contents of a synchronizer component, for example, synchronizer component 206, may be the combining of the two independent memories from stub components 114 and 116 into a single memory of portion 210, or portion 210 may be software and/or hardware that transfers data between the memories of stub components 114 and 116, such that a coherent unified memory image is presented to design logic 122 and 124.

Before the transformation, each stub component of an associated pair of stub components is generally included in a separate clock domain, as shown in FIG. 1 for associated stub components 110 and 112 which are included in respective subsystems 104 and 106 for respective clock domains. The transformation that replaces associated stub components 110 and 112 with synchronizer component 204 may determine an encompassing subsystem for each pair of associated stub component, for example, encompassing subsystem 102 of FIG. 1 that encompasses both the subsystems 104 and 106 corresponding to associated stub components 110 and 112.

To make the appropriate connections to the synchronizer components 204 and 206, subsystems 102, 104, 106, and 108 of FIG. 1 are transformed into subsystems 202, 212, 214, and 216, respectively. The signals on lines 218 between the design logic 118 and the stub component 110 and the signals on lines 220 between the design logic 120 and the stub component 112 are brought into the encompassing subsystem 202 during the transformation. During the transformation, the stub components 110, 112, 114, and 116 are removed from subsystems 104, 106, and 108, and synchronizer components 204 and 206 are added to the encompassing subsystem 202 with appropriate connections to the signals on lines 218, 220, 222, and 224.

Figure 3:
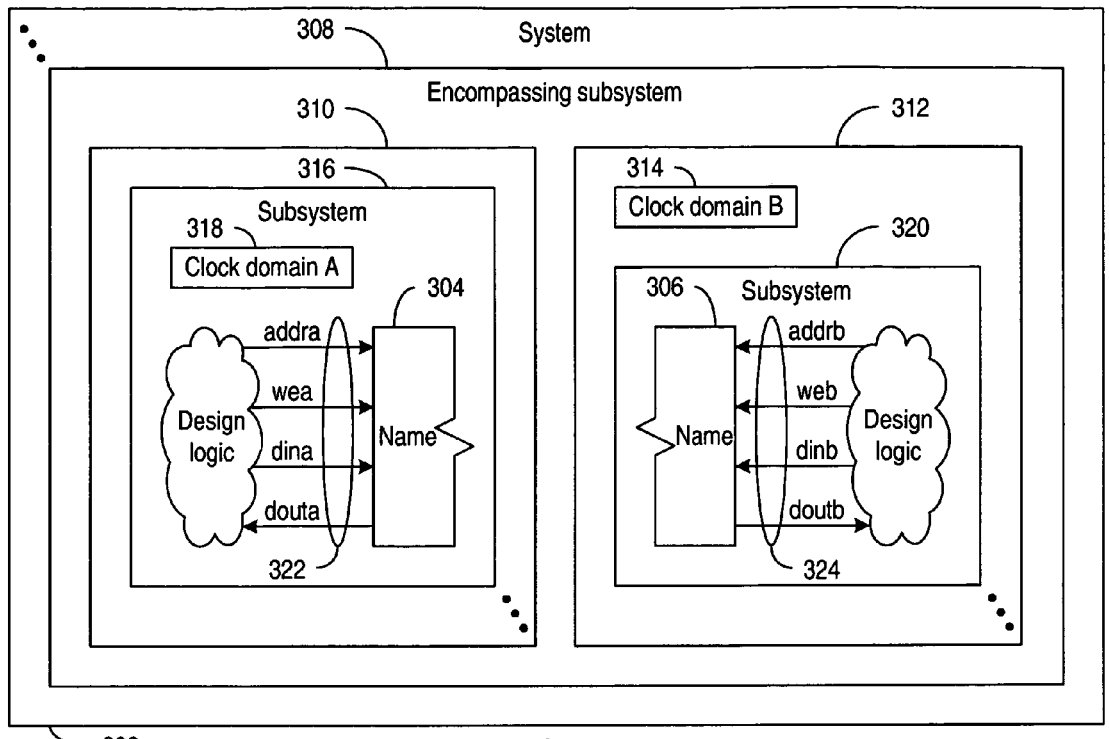
FIG. 3 is a block diagram of a system hierarchy specifying communication between two clock domains using stub components, according to various embodiments of the invention.
Figure 4:
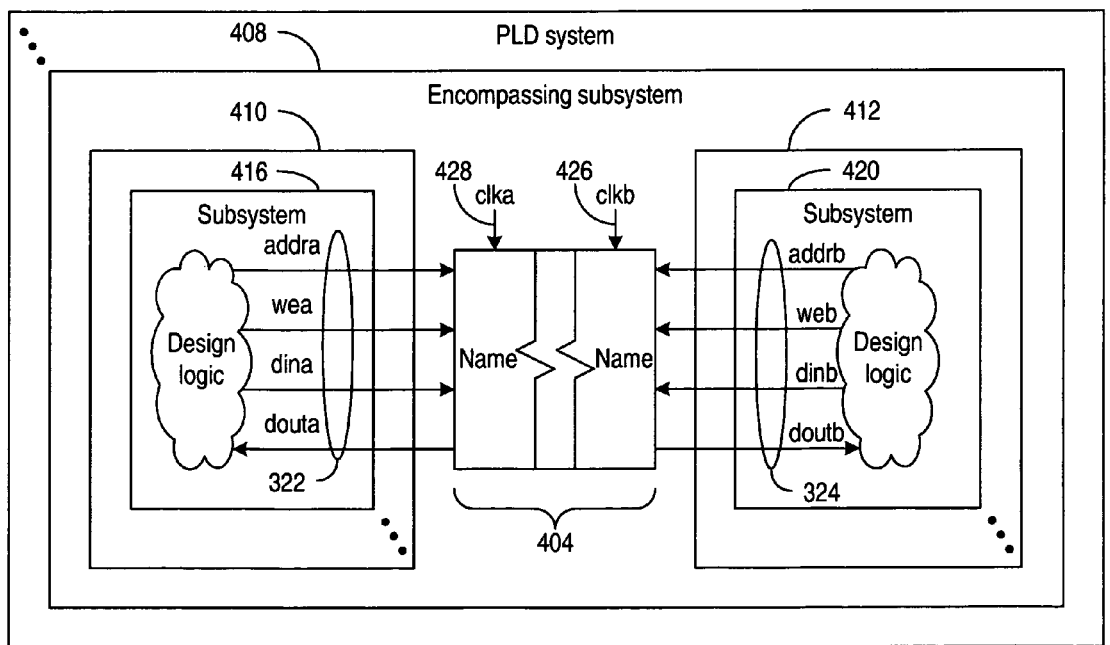
FIG. 4 is a block diagram of a PLD illustrating communication between two clock domains using a synchronizer component, according to various embodiments of the invention.

FIG. 3 is a block diagram of a system hierarchy specifying communication between two clock domains using stub components 304 and 306, according to various embodiments of the invention. FIG. 4 is a block diagram of a PLD illustrating communication between two clock domains using a synchronizer component 404, according to various embodiments of the invention. The system 302 of FIG. 3 may represent a hardware specification that may be transformed into the hardware realization of PLD system 402 of FIG. 4, such as may occur during the generation of a net-list for the hardware realization from the hardware specification.

System 302 may have a hierarchy of subsystems, and certain of the subsystems may be associated with a clock domain. In one embodiment, subsystems may be directly associated with a clock domain, for example subsystem 312 is directly associated with domain-B by tag 314 included in subsystem 312 and subsystem 316 is directly associated with domain-A by tag 318 included in subsystem 316. In another embodiment, subsystems may be indirectly associated with a clock domain by being included in the hierarchy of a subsystem that is directly associated with a clock domain, for example, subsystem 320 may be associated with domain-B by being included in subsystem 312, which is directly associated with domain-B by tag 314. The association of certain subsystems with a clock domain may be done by a global clock domain specification in an alternative embodiment (as later discussed in connection with FIG. 5). It will be appreciated that a tag for a subsystem that associates the subsystem with a clock domain may override another tag for an enclosing subsystem or a global clock domain specification.

To transform the system 302 of FIG. 3 into PLD system 402 of FIG. 4, the stub components 304 and 306 that are associated by the name "Name" are removed and synchronizer component 404 is added. A location in the hierarchy of system 302 for the synchronizer component 404 is determined as an encompassing subsystem 308 with a hierarchy that includes both of the associated stub components 304 and 306.

The transformation of system 302 into PLD system 402 transforms subsystem 316 into subsystem 416 by removing stub component 304 from subsystem 316 while adding ports for the signals on lines 322 to subsystem 316. The transformation adds ports for the signals on lines 322 to any other subsystems 310 in the hierarchy between subsystem 316 and the encompassing subsystem 308 to yield the subsystems 410. Subsystems 320 and 312 are similarly transformed into subsystems 420 and 412. The transformation adds the synchronizer component 404 to the encompassing subsystem 308 while adding connections to the synchronizer component 404 for the signals on lines 322 and 324 and the clocks on lines 426 and 428 for the clock domains of tags 314 and 318, to yield the encompassing subsystem 408. Synchronizer component 404 in one embodiment can be a hardware description language (HDL) component that implements a shared memory, where the shared memory can be an asynchronous dual-port random access memory (RAM). Further description on the shared memory is disclosed in co-pending U.S. patent application Ser. No. 10/949,049, filed Sep. 24, 2004, entitled "Shared Memory Interface for Use in Electronic Design Simulation," by Roger B. Milne, et. al., which is herein incorporated by reference.

Figure 5:
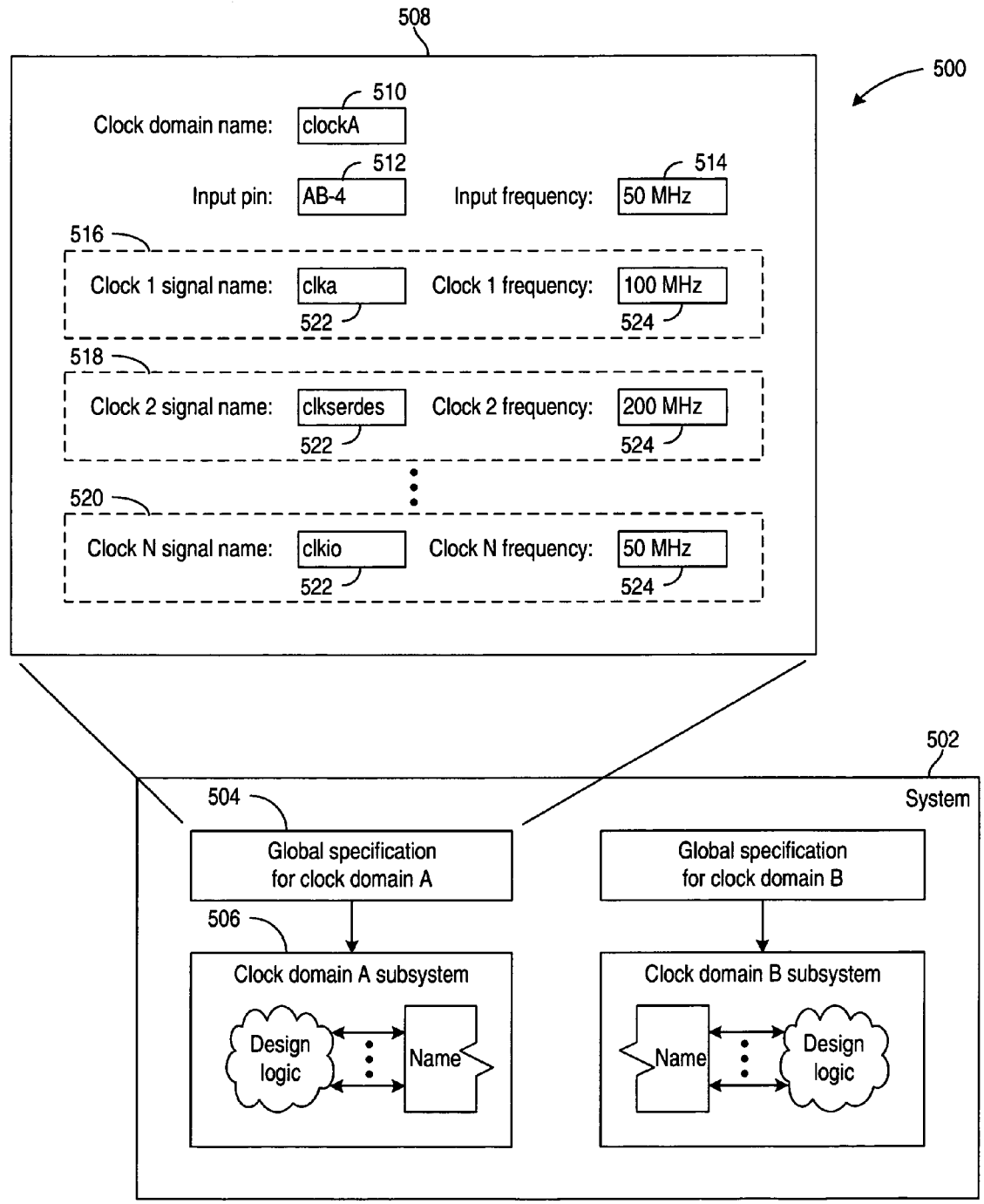
FIG. 5 is a diagram of a user interface permitting a clock domain to be specified globally, according to various embodiments of the invention.

FIG. 5 is a diagram of a user interface 500 permitting a clock domain to be specified globally, according to various embodiments of the invention. The user interface 500 may include a window 502 for a system that includes a global specification 504 for a clock domain that may be associated with a subsystem 506. The user interface 500 may also include a pop-up window 508 for specification 504 that provides a detailed specification for the clock domain.

The window 508 for the clock domain specification may include a field 510 for a name for the clock domain, a field 512 for an input pin that provides a reference clock for the clock domain, and a field 514 for the frequency of the reference clock. Derived clock specifications 516, 518, and 520 may each include a respective field 522 for the clock signal name and a respective field 524 for the frequency of the derived clock.

A subsystem 506 may be associated with the clock domain having the name given by field 510 by the subsystem 506 having an input with a name that matches the name given for field 510 or that matches a name given by one of the fields 522 for the derived clock specifications 516, 518, and 520.

Figure 6:
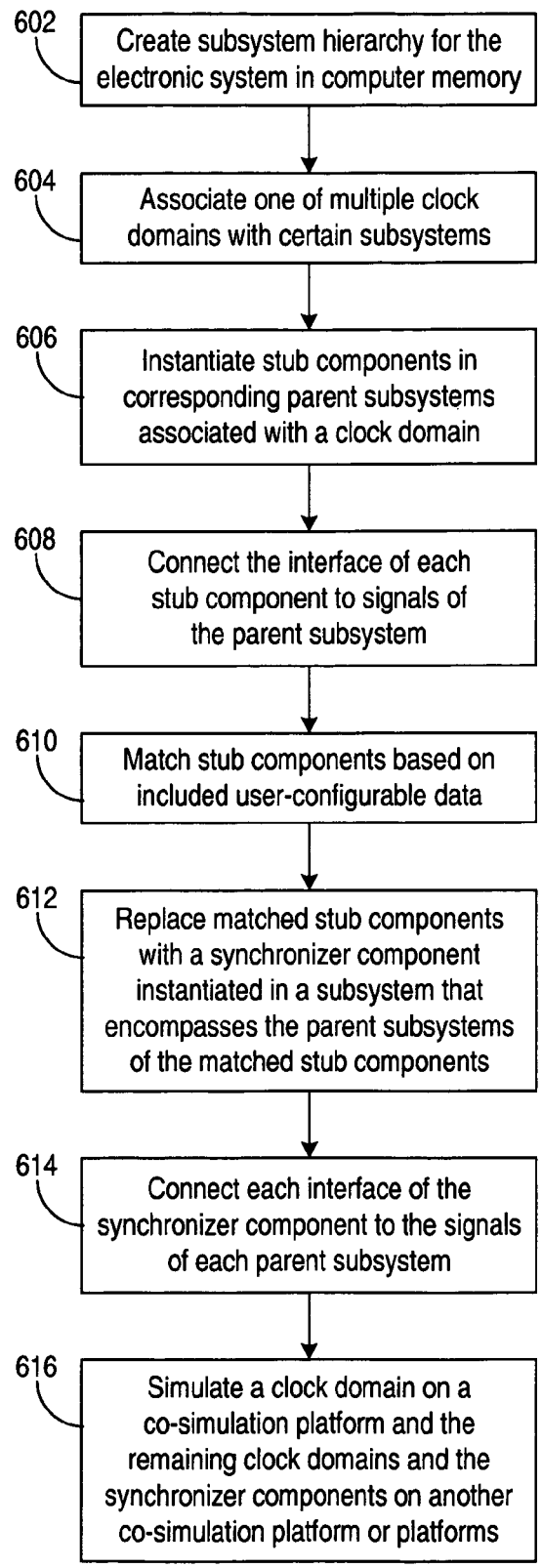
FIG. 6 is a flow diagram of a process for generating an electronic system including multiple clock domains, according to various embodiments of the invention.

FIG. 6 is a flow diagram of a process for generating an electronic system including multiple clock domains, according to various embodiments of the invention.

At step 602, a system with a hierarchy of subsystems is created in the memory of a computing system. The system generally includes at least two clock-synchronous circuits with one or more clock domains for each clock-synchronous circuit. For each clock domain, a subsystem of the system hierarchy separates the clock domain from similar subsystems for the other clock domains.

At step 604, each clock domain is associated with one or more subsystems of the system hierarchy that separate the clock domain from the other clock domains. The association of a clock domain to a subsystem may be from a tag included in the subsystem, from a tag included in an enclosing subsystem of the system hierarchy, or from a global specification of the clock domains. Typically, the clock-synchronous circuits, the clock domains, and the subsystems associated with different clock domains are not coupled at any level in the subsystem hierarchy.

At step 606, the communication between clock domains is represented by instantiating stub components in the clock domains. Each stub component may be instantiated in any subsystem of the hierarchy for the clock domain. Stub components may be associated with each other by a tag, such as a shared name, and typically stub components are associated with each other in pairs that represent the communication between two clock domains. While stub components are typically associated by a shared tag, stub components may alternatively be associated by signal connections between the stub components. The instantiation of a stub component generally also specifies the type of stub component, for example, double-register, dual port memory, or asynchronous FIFO. A stub component is typically selected from a library of stub components, with each stub component having an associated synchronizer component that may also be included in the library or in another library.

A synchronizer component typically allows information to be passed between two clock domains, and two stub components are typically associated with a synchronizer component, with each stub component including the interface of the synchronizer component for respective clock domains. The two stub components associated with a synchronizer component may be different, such as the input stub component and output stub component for an asynchronous FIFO, or identical, such as access stub components for a dual port memory with symmetrical ports.

At step 608, the specification of an electronic system may be completed by connecting appropriate signals to the interfaces of the instantiated stub components. While the specification of the electronic system is complete, the communications between clock domains may be implicitly defined by the paired association of stub components. For certain usages of the specified electronic system, the implicit specification of the communication between clock domains may need to be transformed into an explicit specification of the communication between clock domains. Such a transformation is generally needed during the generation of a net-list for the electronic system that may be used to create a hardware implementation of the electronic system because a hardware implementation generally requires that all communication uses explicitly wired connections. Steps 610, 612, and 614 convert the implicitly specified communication between clock domains into an explicitly specified communication between clock domains. After a user has completed the specification of an electronic system at step 608, steps 610, 612, and 614 may be performed in response to a request by the user to generate a net-list for the electronic system by issuing a simulate command, for example.

At step 610, the stub components are matched based on the association between stub components provided by a shared name for the stub components, for example. At step 612, the matched stub components are replaced by a synchronizer component to transform the implicit specification of the communication between clock domains into an explicit specification of the communication between clock domains. The corresponding synchronizer component is selected based on the type of stub components being replaced with the synchronizer component instantiated in a subsystem that encompasses each of the matched stub components. At step 614, the signal connections corresponding to the interface of each stub component of a set of matched stub components are connected to a respective interface of the synchronizer component, with ports added, as necessary, to subsystems between the subsystem for each stub component and the encompassing subsystem. Both the stub components and associated synchronizer components are in one embodiment described in a HDL such as Verilog or VHDL. In another embodiment the stub components and associated synchronizer components are described in a C based, C++ based, or other programming language.

At step 616, the electronic system is simulated with a first clock domain simulated on a first co-simulation platform, such as a hardware co-simulation platform, and the remaining clock domains and the synchronizer components simulated on another co-simulation platform or on multiple co-simulation platforms. During simulation, values are exchanged between the first co-simulation platform and the other co-simulation platform or platforms for the signals of the first clock domain that are connected to the synchronizer components.

Example co-simulation platforms include both software-based and hardware-based systems. The Modelsim simulator and the NC-SIM simulator from Cadence are example software-based systems, and the Wildcard development platform from Annapolis Microsystems and the Benone development platform from Nallatech are example hardware-based systems. The WildCard and Benone platforms are often used for algorithm exploration and design prototyping.

Those skilled in the art will appreciate that various alternative computing arrangements, including one or more processors and a memory arrangement configured with program code, would be suitable for hosting the processes and data structures of the different embodiments of the present invention. In addition, the processes may be provided via a variety of computer-readable media or delivery channels such as magnetic or optical disks or tapes, electronic storage devices, or as application services over a network.

The present invention is thought to be applicable to a variety of systems for creating electronic systems and particularly applicable and beneficial in creating specifications of electronic systems having multiple clock domains. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A processor-based method for creating an electronic system, comprising:
   creating in a memory arrangement a subsystem hierarchy that includes a plurality of subsystems for the electronic system, wherein at least first and second subsystems of the plurality of subsystems are associated with different clock domains;
   instantiating at least one stub component in the first subsystem and at least one stub component in the second subsystem, wherein the subsystem in which a stub component is instantiated is a parent subsystem, and each stub component has associated user-configurable data, associated type data, and is coupled to a set of signals in the parent subsystem;
   identifying at least one set of matching stub components in the plurality of subsystems based on the user-configurable data of the stub components;
   for each set of matching stub components, selecting a synchronizer component based on the type data of the stub components in the set and replacing the stub components of the set with the selected synchronizer component coupled to each set of signals in the parent subsystems of the stub components of the set of matching stub components.

2. The method of claim 1, further comprising generating a net-list for the electronic system.

3. The method of claim 2, wherein replacing the stub components of the set with the selected synchronizer component includes adding the selected synchronizer component to a subsystem that encompasses the parent subsystems of the stub components of the set.

4. The method of claim 3, wherein the subsystem that encompasses the parent subsystems is a highest level subsystem in the subsystem hierarchy.

5. The method of claim 3, wherein each subsystem of the at least the first and second subsystems is associated with a clock domain by a clock domain specification.

6. The method of claim 5, wherein the clock domain specification includes a name value, a frequency value, and a pin value.

7. The method of claim 5, wherein the clock domain specification for a subsystem is included in a specification of the subsystem.

8. The method of claim 5, wherein the clock domain specification for a subsystem is included in a specification of an ancestor subsystem of the subsystem.

9. The method of claim 5, wherein the clock domain specification for a subsystem is provided by a global specification.

10. The method of claim 9, wherein the global specification includes a specification of each derived clock signal of the clock domain, including a name value and a frequency value for each derived clock signal.

11. The method of claim 5, wherein in response to including a clock domain specification in a specification of a subsystem, the clock domain specification for the subsystem is provided by the clock domain specification included in the specification of the subsystem.

12. The method of claim 11, wherein in response to absence of a clock domain specification in a specification of a subsystem, the clock domain specification for the subsystem is provided by a clock domain specification included in the specification of an ancestor of the subsystem.

13. The method of claim 3, wherein the selected synchronizer component includes double-register synchronization.

14. The method of claim 3, wherein the selected synchronizer component includes a dual port memory.

15. The method of claim 3, wherein the selected synchronizer component includes an asynchronous FIFO.

16. The method of claim 3, wherein a clock domain is controlled by one clock signal.

17. The method of claim 3, wherein a clock domain is controlled by a combination of one clock signal and at least one clock enable derived from the one clock signal.

18. The method of claim 3, wherein a clock domain is controlled by a plurality of clock signals derived from a reference clock signal.

19. The method of claim 3, further comprising:
   simulating one clock domain of the electronic system on a first co-simulation platform;
   simulating each synchronizer component and each clock domain of the electronic system other than the one clock domain on at least one second co-simulation platform; and
   exchanging values between the first co-simulation platform and the at least one second co-simulation platform for each signal in each set of signals in the parent subsystems associated with the one clock domain.

20. The method of claim 19, wherein the first co-simulation platform is a hardware co-simulation platform.

* * * * *